(12) United States Patent
Lin

(10) Patent No.: US 6,316,830 B1
(45) Date of Patent: Nov. 13, 2001

(54) BUMPLESS FLIP CHIP ASSEMBLY WITH STRIPS AND VIA-FILL

(76) Inventor: Charles Wen Chyang Lin, 55 Cairnhill Road, #21-04 Cairnhill Plaza, Singapore (SG), 229666

( * ) Notice: Subject to any disclaimer, the term of this patent is extended or adjusted under 35 U.S.C. 154(b) by 0 days.

(21) Appl. No.: 09/464,562

(22) Filed: Dec. 16, 1999

(30) Foreign Application Priority Data

Dec. 17, 1998 (SG) .................................................. 9804796-2

(51) Int. Cl.$^7$ .................................................. H01L 23/48
(52) U.S. Cl. ............................ 257/737; 257/734; 257/696
(58) Field of Search ..................... 257/690, 696, 257/734, 735, 773, 737

(56) References Cited

U.S. PATENT DOCUMENTS

| | | | |
|---|---|---|---|
| 4,955,523 | 9/1990 | Calomagno et al. | 228/179 |
| 4,970,571 | 11/1990 | Yamakawa et al. | 357/71 |
| 4,984,358 | 1/1991 | Nelson | 29/830 |
| 5,074,947 | 12/1991 | Estes et al. | 156/307.3 |
| 5,106,461 | 4/1992 | Volfson et al. | 205/125 |
| 5,116,463 | 5/1992 | Lin et al. | 156/653 |

(List continued on next page.)

FOREIGN PATENT DOCUMENTS

| | | | |
|---|---|---|---|
| 0 718 882 A1 | 6/1996 | (EP) | H01L/23/057 |
| WO 99/57762 | 11/1999 | (WO) | H01L/23/48 |
| WO 97/38563 | 10/1997 | (WO) | H05K/1/03 |

OTHER PUBLICATIONS

Markstein et al., "Controlling the Variables in Stencil Printing," Electronic Packaging & Production, Feb. 1997, pp. 48–56.

Elenius, "Choosing a Flip Chip Bumping Supplier—Technology an IC Package contractor should look for," Advanced Packaging, Mar./Apr. 1998, pp. 70–73.

Erickson, "Wafer Bumping: The Missing Link for DCA," Electronic Packaging & Production, Jul. 1998, pp. 43–46.

Kuchenmeister et al., "Film Chip Interconnection Systems Prepared By Wet Chemical Metallization," IEEE publication 0–7803–4526–6/98, Jun. 1998, 5 pages.

Ghaffarian, "Long Time BGA Assembly Reliability," Advancing Microelectronics, vol. 25, No. 6, Sep./Oct. 1998, pp. 20–23.

U.S. Application No. 09/120,408, filed Jul. 22, 1998, entitled "Flip Chip Assembley With Via Interconnection".

U.S. Application No. 09/465,024, filed Dec. 16, 1999, entitled "Bumpless Flip Chip Assembly With Solder Via".

U.S. Application No. 09/464,561, filed Dec. 16, 1999, entitled "Bumpless Flip Chip Assembly With Strips–In–Via And Plating".

*Primary Examiner*—Eddie Lee
*Assistant Examiner*—Lourdes Cruz
(74) *Attorney, Agent, or Firm*—David M. Sigmond

(57) ABSTRACT

A flip chip assembly, and methods of making the same, including a substrate having a plurality of via holes, wherein pre-formed strips or leads hanging in the via holes and conductive material filled in the via holes together serve as the electrical connection between a semiconductor device and substrate circuitry. The method of manufacturing the flip chip assembly includes attaching an integrated circuit (IC) chip having a plurality of input/output terminal pads to a rigid or flexible substrate having a plurality of leads extending from patterned circuitry traces and hanging inside a plurality of via holes. The via holes are aligned with and expose the terminal pads. After attachment, an electrically conductive material, for example adhesive or solder, is filled into the via holes thereby connecting the leads to the terminal pads. The conductive material not only provides mechanical support but also electrical continuity between the IC chip and the circuitry of the substrate.

26 Claims, 7 Drawing Sheets

U.S. PATENT DOCUMENTS

| | | | |
|---|---|---|---|
| 5,137,845 | 8/1992 | Lochon et al. | 437/183 |
| 5,167,992 | 12/1992 | Lin et al. | 427/437 |
| 5,196,371 | 3/1993 | Kulesza et al. | 437/183 |
| 5,209,817 | 5/1993 | Ahmad et al. | 156/643 |
| 5,237,130 | 8/1993 | Kulesza et al. | 174/260 |
| 5,260,234 | 11/1993 | Long | 437/203 |
| 5,261,593 | 11/1993 | Casson et al. | 228/180.22 |
| 5,275,330 | 1/1994 | Issacs et al. | 228/180.2 |
| 5,284,796 | 2/1994 | Nakanishi et al. | 437/183 |
| 5,293,067 | 3/1994 | Thompson et al. | 257/668 |
| 5,327,010 * | 7/1994 | Uenaka et al. | 257/679 |
| 5,334,804 | 8/1994 | Love et al. | 174/267 |
| 5,346,750 | 9/1994 | Hatakeyama et al. | 428/209 |
| 5,355,283 | 10/1994 | Marrs et al. | 361/760 |
| 5,358,621 | 10/1994 | Oyama | 205/123 |
| 5,397,921 | 3/1995 | Karnezos | 257/779 |
| 5,407,864 | 4/1995 | Kim | 437/203 |
| 5,424,245 | 6/1995 | Gurtler et al. | 437/183 |
| 5,438,477 | 8/1995 | Pasch | 361/689 |
| 5,439,162 | 8/1995 | George et al. | 228/180.22 |
| 5,447,886 | 9/1995 | Rai | 437/183 |
| 5,454,161 | 10/1995 | Beilin et al. | 29/852 |
| 5,454,928 | 10/1995 | Rogers et al. | 205/125 |
| 5,475,236 | 12/1995 | Yoshizaki | 257/48 |
| 5,477,933 | 12/1995 | Nguyen | 174/262 |
| 5,478,007 | 12/1995 | Marrs | 228/180.22 |
| 5,483,421 | 1/1996 | Gedney et al. | 361/771 |
| 5,484,647 | 1/1996 | Nakatani et al. | 428/209 |
| 5,487,218 | 1/1996 | Bhatt et al. | 29/852 |
| 5,489,804 | 2/1996 | Pasch | 257/778 |
| 5,493,096 | 2/1996 | Koh | 219/121.71 |
| 5,508,229 | 4/1996 | Baker | 437/183 |
| 5,525,065 | 6/1996 | Sobhani | 439/67 |
| 5,536,973 | 7/1996 | Yamaji | 257/737 |
| 5,542,601 | 8/1996 | Fallon et al. | 228/119 |
| 5,547,740 | 8/1996 | Higdon et al. | 428/209 |
| 5,556,810 | 9/1996 | Fujitsu | 437/209 |
| 5,556,814 | 9/1996 | Inoue et al. | 437/230 |
| 5,564,181 | 10/1996 | Dineen et al. | 29/841 |
| 5,572,069 | 11/1996 | Schneider | 257/690 |
| 5,576,052 | 11/1996 | Arledge et al. | 427/98 |
| 5,583,073 | 12/1996 | Lin et al. | 439/183 |
| 5,595,943 | 1/1997 | Itabashi et al. | 437/230 |
| 5,599,744 | 2/1997 | Koh et al. | 437/195 |
| 5,611,140 | 3/1997 | Kulesza et al. | 29/832 |
| 5,611,884 | 3/1997 | Bearinger et al. | 156/325 |
| 5,613,296 | 3/1997 | Kurino et al. | 29/852 |
| 5,614,114 | 3/1997 | Owen | 219/121.66 |
| 5,615,477 | 4/1997 | Sweitzer | 29/840 |
| 5,619,791 | 4/1997 | Lambrecht, Jr. et al. | 29/852 |
| 5,627,405 | 5/1997 | Chillara | 257/668 |
| 5,627,406 | 5/1997 | Pace | 257/700 |
| 5,633,204 | 5/1997 | Tago et al. | 438/614 |
| 5,637,920 | 6/1997 | Loo | 257/700 |
| 5,641,113 | 6/1997 | Somaki et al. | 228/180.22 |
| 5,645,628 | 7/1997 | Endo et al. | 106/1.23 |
| 5,646,067 | 7/1997 | Gaul | 437/180 |
| 5,648,686 | 7/1997 | Hirano et al. | 257/778 |
| 5,654,584 | 8/1997 | Fujitsu | 257/666 |
| 5,656,858 | 8/1997 | Kondo et al. | 257/737 |
| 5,663,598 | 9/1997 | Lake et al. | 257/737 |
| 5,665,652 | 9/1997 | Shimizu | 438/127 |
| 5,666,008 | 9/1997 | Tomita et al. | 257/778 |
| 5,669,545 | 9/1997 | Pham et al. | 228/1.1 |
| 5,674,785 | 10/1997 | Akram et al. | 437/217 |
| 5,674,787 | 10/1997 | Zhao et al. | 437/230 |
| 5,682,061 | 10/1997 | Khandros et al. | 257/666 |
| 5,691,041 | 11/1997 | Frankeny et al. | 428/209 |
| 5,722,162 | 3/1998 | Chou et al. | 29/852 |
| 5,723,369 | 3/1998 | Barber | 438/106 |
| 5,731,223 | 3/1998 | Padmanabhan | 437/183 |
| 5,736,456 | 4/1998 | Akram | 438/614 |
| 5,739,585 | 4/1998 | Akram et al. | 257/698 |
| 5,744,859 * | 4/1998 | Ouchida | 257/786 |
| 5,757,071 | 5/1998 | Bhansali | 257/697 |
| 5,757,081 | 5/1998 | Chang et al. | 257/778 |
| 5,764,486 | 6/1998 | Pendse | 361/774 |
| 5,774,340 | 6/1998 | Chang et al. | 361/771 |
| 5,789,271 | 8/1998 | Akram | 438/18 |
| 5,798,285 | 8/1998 | Bentlage et al. | 438/108 |
| 5,801,072 | 9/1998 | Barber | 438/107 |
| 5,801,447 | 9/1998 | Hirano et al. | 257/778 |
| 5,803,340 | 9/1998 | Yeh et al. | 228/56.3 |
| 5,804,771 | 9/1998 | McMahon et al. | 174/255 |
| 5,808,360 | 9/1998 | Akram | 257/738 |
| 5,811,879 | 9/1998 | Akram | 257/723 |
| 5,817,541 | 10/1998 | Averkiou et al. | 438/107 |
| 5,822,856 | 10/1998 | Bhatt et al. | 29/832 |
| 5,834,844 * | 11/1998 | Akagawa et al. | 257/734 |
| 5,861,666 | 1/1999 | Bellaar | 257/686 |
| 5,863,816 | 1/1999 | Cho | 438/123 |
| 5,870,289 | 2/1999 | Tokuda et al. | 361/779 |
| 5,883,435 * | 3/1999 | Geffken et al. | 257/758 |
| 5,925,931 * | 7/1999 | Yamamoto | 257/738 |
| 5,994,222 | 11/1999 | Smith et al. | 438/689 |
| 6,012,224 | 1/2000 | DiStefano et al. | 29/840 |
| 6,013,877 | 1/2000 | Degani et al. | 174/264 |
| 6,018,196 | 1/2000 | Noddin | 257/777 |
| 6,020,561 | 2/2000 | Ishida et al. | 174/261 |
| 6,037,665 | 3/2000 | Miyazaki | 257/773 |
| 6,046,909 | 4/2000 | Joy | 361/748 |
| 6,084,297 | 6/2000 | Brooks et al. | 257/698 |
| 6,084,781 | 7/2000 | Klein | 361/771 |
| 6,103,552 | 8/2000 | Lin | 438/113 |
| 6,103,992 | 8/2000 | Noddin | 219/121.71 |
| 6,127,204 | 10/2000 | Isaacs et al. | 438/106 |

* cited by examiner

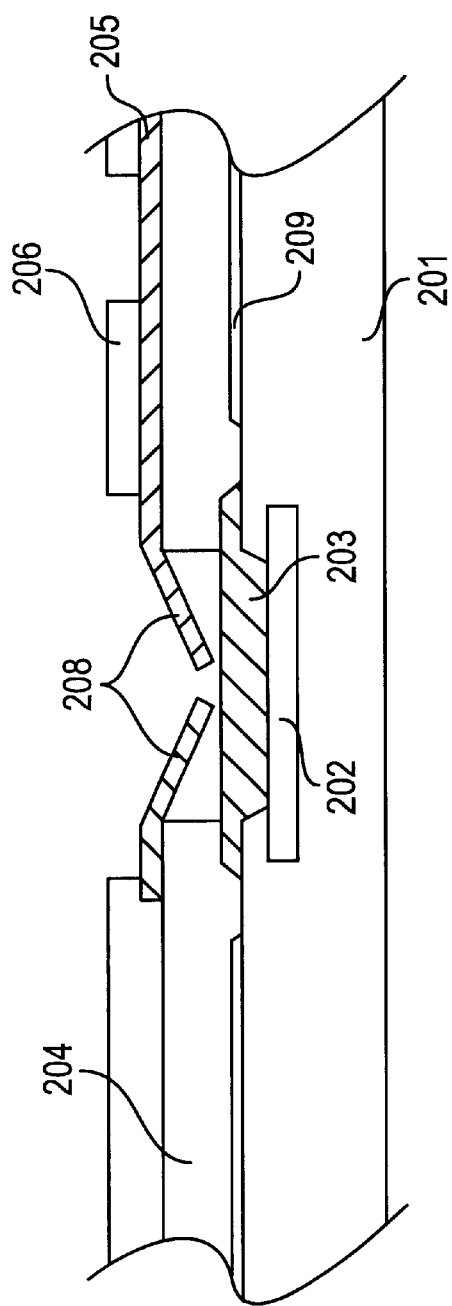
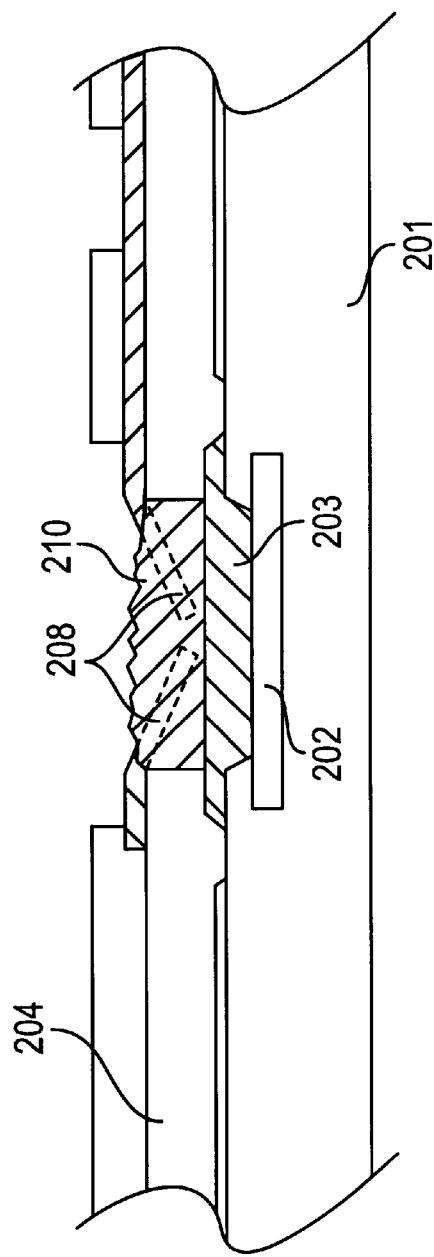
FIG. 2C
FIG. 2D

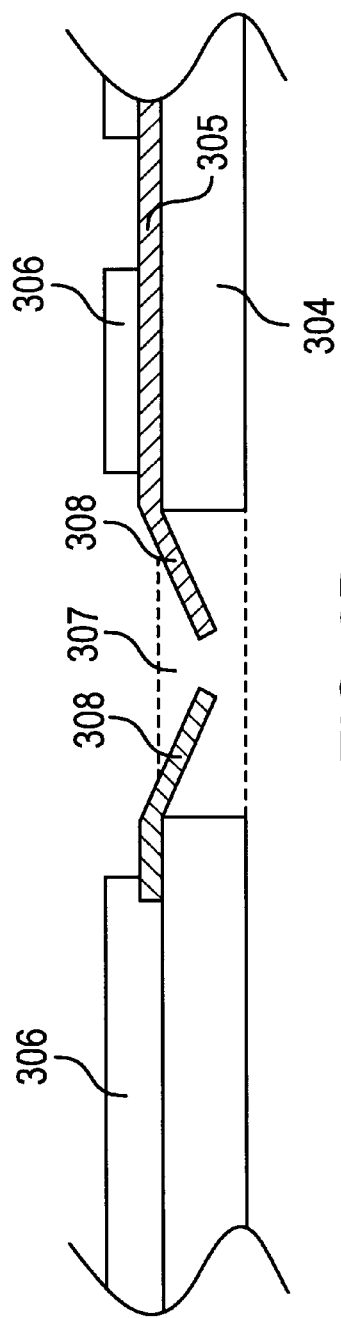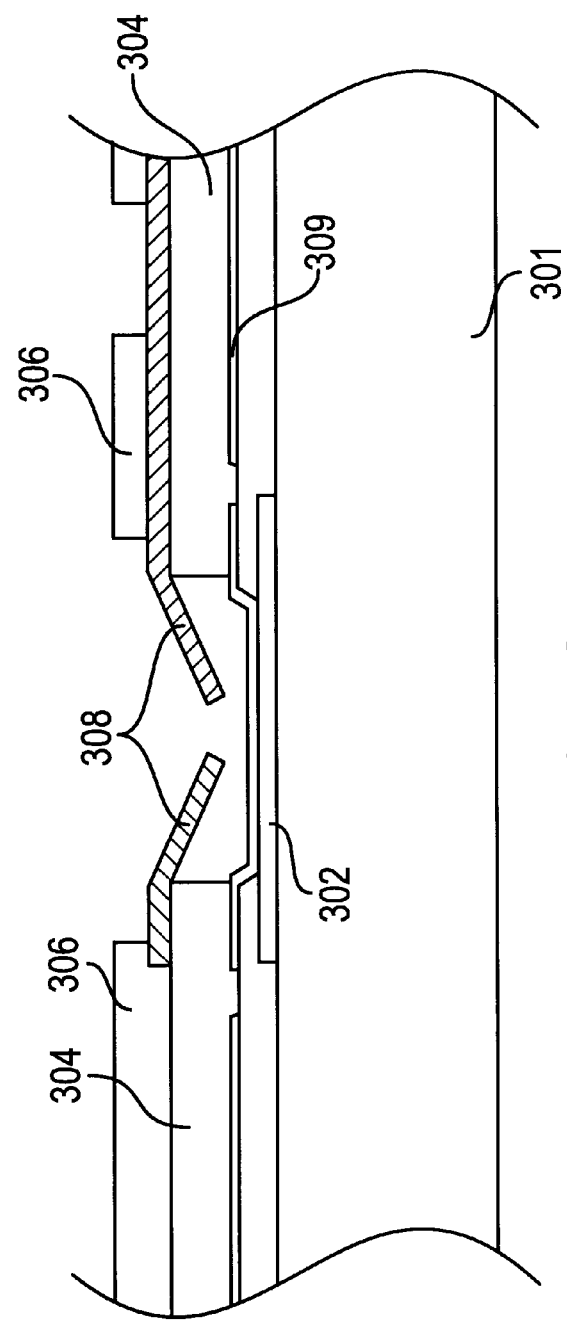

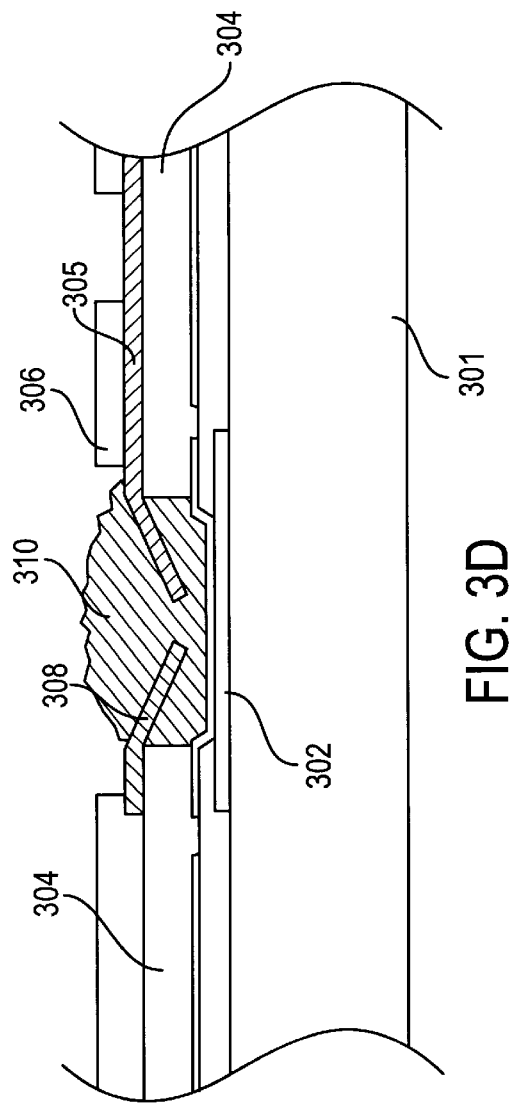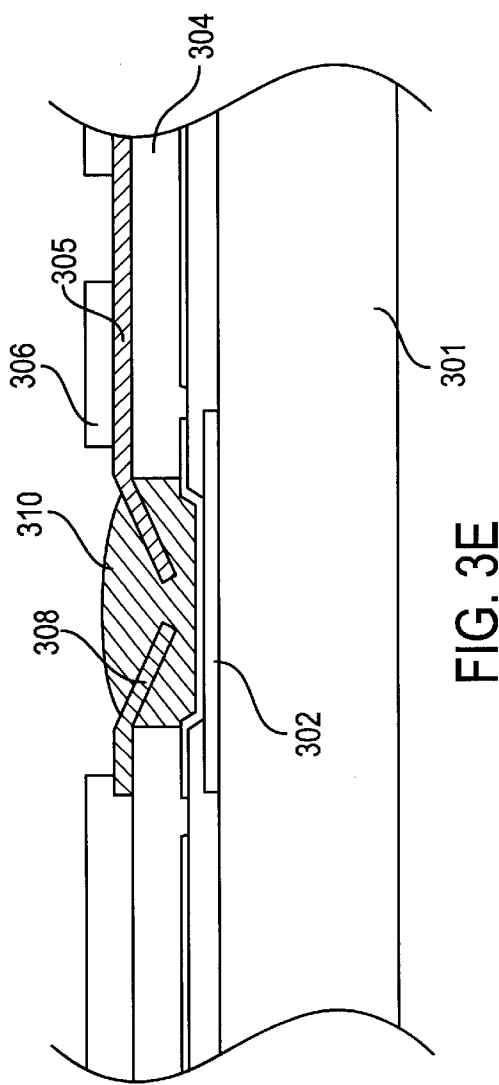

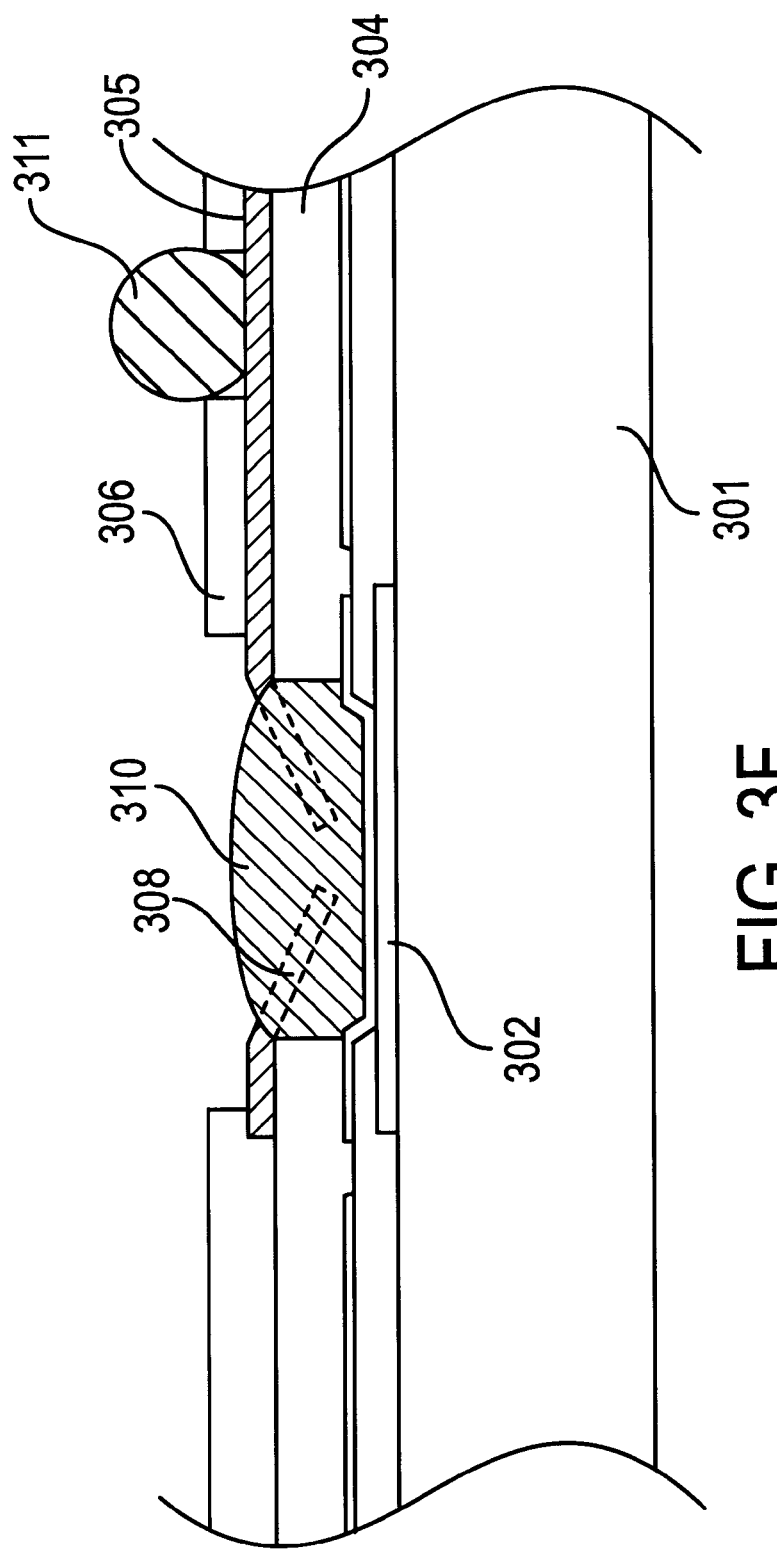

BUMPLESS FLIP CHIP ASSEMBLY WITH STRIPS AND VIA-FILL

The present application is an application filed in accordance with 35 U.S.C. §119 and claims the benefit of earlier filed Singapore application number 9804796-2 filed on Dec. 17, 1998.

1. Field of the Invention

This invention relates generally to a semiconductor device assembly, and in particular, to a chip assembly which includes a single or multi-layered substrate of which circuitry traces are connected to the input/output terminal pads of the IC chip through deposition of conductive material into substrate via holes and onto preformed leads and the terminal pads.

2. Background of the Invention

Recent developments of semiconductor packaging suggest an increasingly critical role of the technology. New demands are coming from requirements for more leads per chip and hence smaller input/output terminal pad pitch, shrinking die and package footprints, and higher operational frequencies that generate more heat, thus requiring advanced heat dissipation designs. All of these considerations must be met and, as usual, are placed in addition to the cost that packaging adds to the semiconductor manufacturing food chain.

Conventionally, there are three predominant chip-level connection technologies in use for integrated circuits, namely, wire bonding, tape automated bonding (TAB) and flip chip (FC), to electrically or mechanically connect integrated circuits to leadframe or substrate circuitry. Conventional flip chip technology is characterized as mounting of an unpackaged semiconductor chip with the active side facing down to an interconnect substrate through contact anchors such as solder, gold or organic conductive adhesive bumps. The major advantage of flip chip technology is the short interconnects, which, therefore, can handle high speed or high frequency signals. There are essentially no parasitic elements, such as inductance. Not only is the signal propagation delay slashed, but much of the waveform distortion is also eliminated. Flip chip also allows an array interconnecting layout that provides more I/O than a perimeter interconnect with the same die size. Furthermore, it requires minimal mounting area and weight which results in overall cost saving since no extra packaging and less circuit board space is used. An example of such a method is disclosed in U.S. Pat. No. 5,261,593 issued to Casson et al.

While flip chip technology shows tremendous advantages over wire bonding, its cost and technical limitations are significant. First of all, prior art flip chip technology must confront the challenge of forming protruded contact anchors or bumps to serve as electrical connections between the integrated circuit chip and substrate circuitry. Examples of such an approach are disclosed in U.S. Pat No. 5,803,340 issued to Yeh et al. and U.S. Pat. No. 5,736,456 issued to Akram. They typically include a very costly vacuum process to deposit an intermediate under-bump layer that serves as an adhesive and diffusion barrier. This barrier layer is typically composed of a film stack that can be in the structure of chromium/copper/gold. Bumping materials such as solder are subsequently deposited onto this intermediate layer through evaporation, sputtering, electroplating, solder jetting or paste printing methods followed by a reflow step to form the solder contacts.

Although evaporation and sputtering can potentially offer high density bumps, these processes need very tight control and normally result in a poor yield. In addition, from the mechanical structure viewpoint, the coefficient of thermal expansion (CTE) of silicon and the substrate may be quite different, causing the stress between these two parts after attachment to build up and become fully loaded on the bumps. This can then cause severe joint cracking and disconnection problems during normal operating conditions. As a result, a conventional flip chip assembly is not only very costly but also suffers from very serious reliability problems and a high fatality ratio.

Organic contacts, which utilize conductive adhesive to replace solder, are described in U.S. Pat. No. 5,627,405 issued to Chillara and U.S. Pat. No. 5,611,140 issued to Kulesza et al. Generally speaking, the conductive adhesive which is made by adding conductive fillers to polymer binders holds a number of technical advantages such as environmental compatibility, lower temperature processing capability, fine pitch and simplified processes compared to soldering. However, conductive adhesives do not normally form a metallurgical interface in the classical sense. The basic electrical pathway is through conductive particles of the adhesives that are in contact with one another and reach out to the two contact surfaces of the components.

In view of the limitations of currently available integrated circuit assembling methods, a high performance, reliable and economical method that can effectively interconnect integrated circuits to the external circuitry would be greatly desirable.

SUMMARY OF THE INVENTION

It is therefore an object of the present invention to provide a flip chip assembly to address high density, low cost and high performance requirements of semiconductor packaging. The present invention involves the bonding of substrate circuitry to a semiconductor device through the connection of preformed leads inside the via apertures or holes to IC terminal pads beneath the via holes without the need for conventional bumps, bonding wire, or other media. This provides both electrical and mechanical connection between the IC chip and circuitry of the substrate.

In accordance with an aspect of the invention, a flip chip assembly includes a semiconductor chip including a terminal pad, a substrate including a dielectric layer and an electrically conductive trace, wherein the dielectric layer includes first and second surfaces that are opposite one another and a via hole that extends between the first and second surfaces, the conductive trace is disposed on the first surface and bent proximate to a corner between the first surface and the via hole at a different angle than the corner and extends into the via hole without extending to the second surface and without contacting the terminal pad, the via hole is aligned with the terminal pad, and the second surface is attached to the chip, and an electrically conductive material in the via hole that contacts the conductive trace and electrically connects the conductive trace to the terminal pad.

Preferably, the conductive trace laterally extends across a majority of a diameter of the via hole and vertically extends across a majority of a depth of the via hole and contacts substantially none of the dielectric layer at sidewalls of the via hole, the conductive material contacts substantially all of the dielectric layer at sidewalls of the via hole, substantially all of the conductive material is within the via hole, and the conductive trace and the conductive material are the only materials in the via hole. Suitable conductive materials include conductive adhesives and solder.

Using extended leads and conductive material directly deposited in the via hole can effectively connect the IC chip and substrate circuitry without external bumps or wires. This approach allows a highly reliable, low profile, high performance and low cost assembly to be achieved. In particular, a small via hole formed by laser drilling or other techniques allows a very fine pitch terminal pad to be interconnected, which can significantly enhance the capability of packaging future high I/O semiconductor chips.

BRIEF DESCRIPTION OF THE DRAWINGS

FIGS. 2A–2E are fragmented partial sectional side elevational views showing sequentially the method of dispensing conductive adhesive into the via holes followed by curing according to an embodiment of the present invention.

FIGS. 3A–3F are fragmented partial sectional side elevational views showing sequentially the method of solder paste printing into the via holes followed by solder re-flowing according to another embodiment of the present invention.

DETAILED DESCRIPTION OF THE INVENTION

Figure 1:
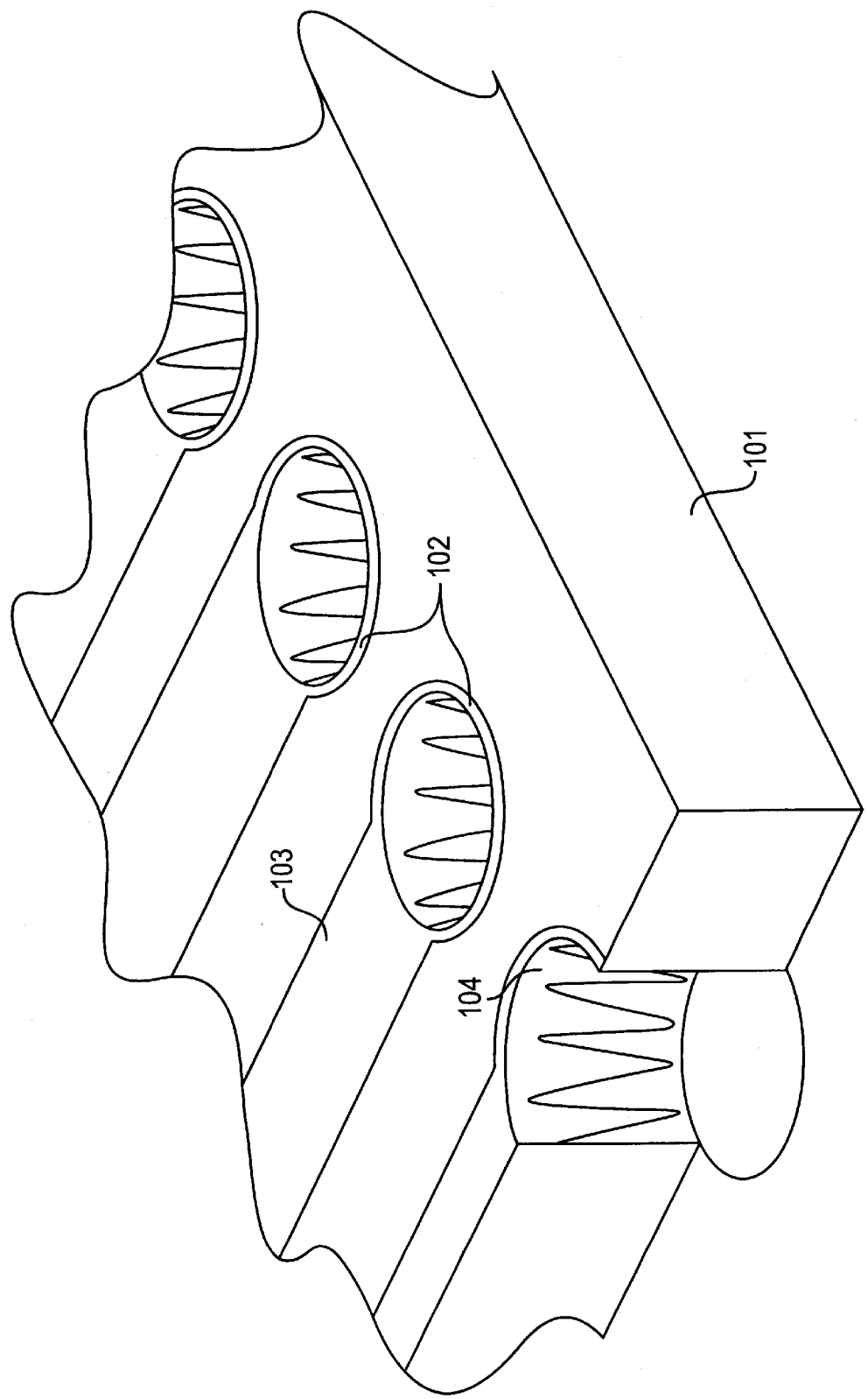
FIG. 1 is a fragmented partial sectional perspective view of a substrate showing via holes and traces of the substrate circuitry according to an embodiment of the present invention.

The bumpless flip chip assembly of the present invention includes a rigid or flexible dielectric substrate having a plurality of electrically conductive circuitry traces and a plurality of via holes formed in the dielectric substrate. The conductive traces on the surface of the substrate extend into the via holes through leads that are fabricated by conventional circuitry patterning, cutting or punching methods. FIG. 1 is a perspective view of a section of such a substrate 101 in which via holes 102 are formed by laser or mechanical drilling. Via holes 102 serve as interconnecting channels between circuitry traces 103 and IC terminal pads (not shown) that are subsequently disposed beneath the via holes through the pre-formed leads 104 hanging inside the via holes and an electrically conductive material (not shown) that is subsequently deposited into the via holes. Circuitry traces 103, which extend from via holes 102 along an outer surface of the substrate 101 lead to another pad connection for next level assembly.

The orientation of the contact ensures that at least one of the via holes in the dielectric substrate is aligned with a pad of the IC chip so that the pad can be totally or partially exposed through the opposite side of the substrate. After alignment, the IC chip is attached to the dielectric substrate through adhesive film or paste, or mechanical techniques to form an assembly. Electrically conductive material is subsequently filled into the via holes to connect the leads to the input/output terminal pads of the IC chip. The filled conductive material in the via holes provides electrical and mechanical connections between the chip and the traces of the substrate circuitry. After the substrate circuitry is connected to the terminal pad, the mechanical and chemical elements used to attach the chip and substrate can be removed. In the alternative, these elements can be left as an integral part of the assembly to provide mechanical support.

As defined herein, the preferred embodiment is particularly directed to the bonding of an integrated circuit (IC) chip to a flexible circuitized substrate, or to a more rigid, circuitized substrate, a particular example of the latter being a printed circuit board. It is to be understood, however, that the invention is not limited to attachment to printed circuit boards, in that other circuitized substrates, including known flexible substrate tapes, plastic substrates or ceramic substrates, may be employed. In general, an organic-type substrate is preferable for lower cost and superior dielectric property whereas an inorganic-type substrate is preferable when high thermal dissipation and matched coefficient of expansion are desired. The term "substrate" as used herein is defined as at least one layer of dielectric material having at least one conductive layer thereon. Printed circuit boards of similar type are well known in the electronics industry, as well as the processes for making the same, and therefore, further definition is not believed to be necessary. Such structures may include many more electrically conductive layers than those depicted in FIGS. 1 through 3F, depending on the desired operational characteristics. As is known, such electrically conductive layers may function as signal, power, and/or ground layers.

In one embodiment of the invention, the conductive material that connects the leads to the pads may be deposited in the via holes by solder paste printing, solder jetting or solder particle placement. The most common solder in use today is tin-lead solder, although the invention is not limited to this particular type. For solder paste, a typical example includes 80% solder solids and 20% flux paste although the invention is not limited to this ratio. Solder paste is applied preferably using a screening procedure known in the art. After the solder paste is dispensed onto the screen, the paste is forced through the holes in the screen and into the substrate via holes. The screen is then removed, leaving the desired quantity of paste in each via hole.

It should be understood that the particular solder paste and methods of dispensing depicted above are not meant to limit the invention, in that it is also possible to place solder paste by stencil printing, direct dispensing or other methods. Heat, to a predetermined temperature sufficient to cause solder paste to "ball up", is then applied to the assembly, at least in the vicinity of the via holes. A preferred application of such heat is achieved by using a laser. Alternatively, the assembly may be placed in a suitable oven to effect solder re-flow and bonding to the IC terminal pads as well as the extended leads inside of the via holes. One example of such an approach is an infrared (IR) continuous belt re-flow oven. As yet another alternative, hot nitrogen gas may be directed onto the solder members. This re-flow formation results in solder joints which electrically and physically interconnect the leads and pads. This not only allows a wide selection of the solder system but also assures very low stress and therefore reliable connection between the substrate and chip due to the flexibility of the strips.

In another embodiment of the invention, the conductive material that connects the leads to the pads is a conductive adhesive. The conductive adhesive holds a number of technical advantages such as environmental compatibility, lower temperature processing capability, and simplified processes compared to soldering. Typically, the conductive adhesive comprises a solution of polymerizable pre-cursor, fine metal particles and a hardener, forming a paste. This paste can be filled into the via holes through screen printing, stencil printing or direct dispensing methods. After the conductive adhesive paste is filled in, external energy such as heat or UV light is applied so that the adhesive is cured and hardened thus providing an effective electrical and mechanical connection between the circuitry leads and the IC terminal pads. This assures a very low cost and environmentally friendly package. A connection between the filled conductive material and a metallized via wall in addition to the leads provides an improved interface between the substrate and chip due to a larger contact area.

A barrier layer over-coated on an aluminum terminal pad is preferred although a copper terminal pad may not need further protection. This over coating conditions the pad surface for solder wetting and protects the underlying material against leaching, oxidation or degradation resulting from intermetallic formation during exposure to the soldering material and heat. This coating can be accomplished by sputtering a stake of thin film or by wet chemical plating such as electroless nickel and immersion gold.

The contacting leads that are located inside of the via holes may take the form of strips with various shapes. Preferably, the leads are fabricated by conventional photolithographic patterning and etching processes. Alternately, the leads can be fabricated by micromachining or laser cutting. After these leads are formed, they are bent toward the inside of the via holes in order to provide an effective connection path between the IC pads and the substrate circuitry. The bending of the leads can be achieved by a variety of methods such as vacuum suction, air blowing or mechanical pushing.

The via holes of the substrate can be formed by various techniques including mechanical drilling, punching, plasma etching or laser drilling. They can be formed before or after copper lamination depending on the substrate manufacturing process. The via holes are formed at locations that can be aligned with and expose input/output terminal pads of the semiconductor chip or chips that are subsequently mounted on the side of the substrate opposite the side where the electrical circuitry is formed.

If the finished product is, for instance, a ball grid array package (BGA), solder balls will normally be placed on the specific traces on the surface of the dielectric substrate. This finished package can be connected to a printed circuit board by reflowing the solder balls to form an attachment to the conductors of the printed circuit board.

The present invention will be illustrated further by the following examples. These examples are meant to illustrate and not to limit the invention, the scope of which is defined solely by the appended claims.

EXAMPLE 1

Figure 2A:
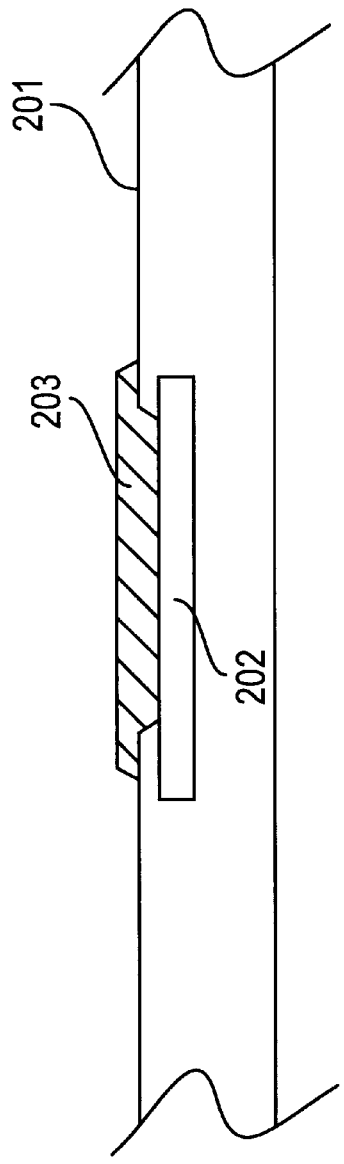

FIG. 2A shows an integrated circuit chip 201 with various types of transistors, wiring and the like (not shown) which has a plurality of exposed input/output terminal pads 202 (only one shown). Pads 202 are firstly cleaned by dipping the integrated circuit chip 201 in a phosphoric acid solution at room temperature with an immersion time of 10 minutes to remove the surface oxide film. The chip is next dipped in a diluted catalytic solution Enthone "Alumon EN" at 25 degrees Celsius for 20 seconds to form a thin zinc film (not shown) on the surface of aluminum alloy pads 202. Subsequent steps include a thorough distilled water rinse and electroless plating using Shipley "NIPOSIT 468" at 85 degrees Celsius. The electroless plating continuously deposits a thin layer of nickel film 203 containing phosphorous (to be referred to as a nickel film hereafter) on the input/output terminal pads 202 of the integrated circuit chip 201.

Figure 2B:
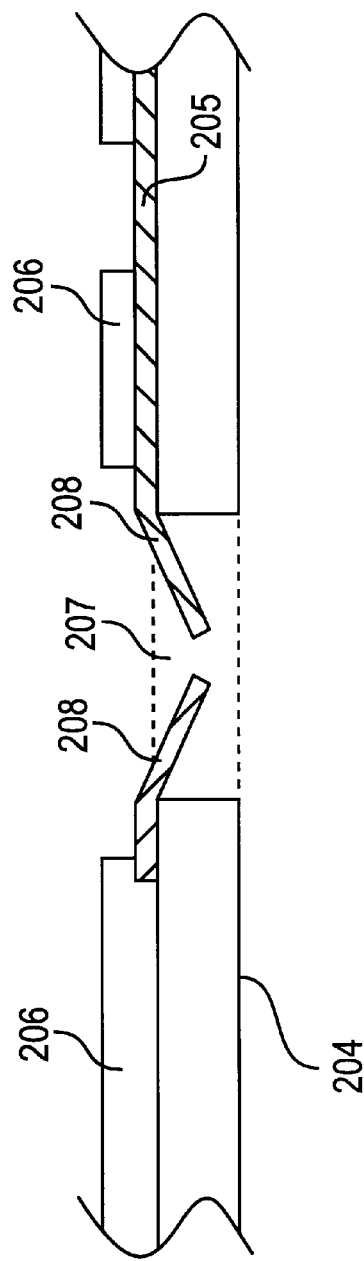

FIG. 2B shows a cross sectional view of the dielectric substrate 204 having a plurality of circuitry traces 205 partially covered by the solder mask 206. Circuitry traces 205 extend to via holes 207 and split into a plurality of leads 208 which are bent toward the inside of the via holes. Via holes 207 are formed in such a manner that the terminal pads 202 of the integrated circuit chip 201 can be totally or partially exposed when integrated circuit chip 201 is subsequently mounted on the substrate 204. The leads 208 are bent toward the terminal pads 202 and serve as the electrically connecting channels for respective traces 205 of the substrate 204 with respective terminal pads 202 of the integrated circuit chip 201.

As shown in FIG. 2C, the substrate 204 is next securely attached to the IC chip 201 by the adhesive paste ABLESTIK "ABLEBOND 961-2" 209.

As shown in FIG. 2D, the electrically conductive epoxy paste Solder-Sub "ME 8659-SMT" 210 is filled into the via holes 207. The filled conductive epoxy paste is cured at 150 degrees Celsius for 5 minutes to harden which increases the bonding strength between circuit leads 208 and terminal pads 202. These conductive epoxy joints provide effective electrical and mechanical connections between the pads 202 and the traces 205, thereby completing the fabrication of the electrical bonding interconnect.

Figure 2E:
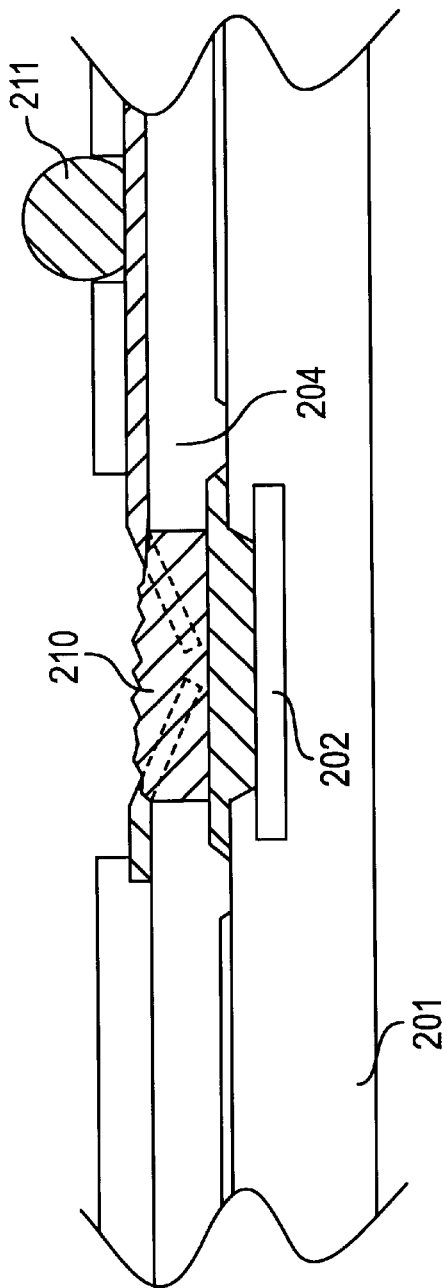

As shown in FIG. 2E, the solder ball 211 is attached to the connection pad of the trace 205 and the package is ready for the next level assembly.

EXAMPLE 2

Figure 3A:
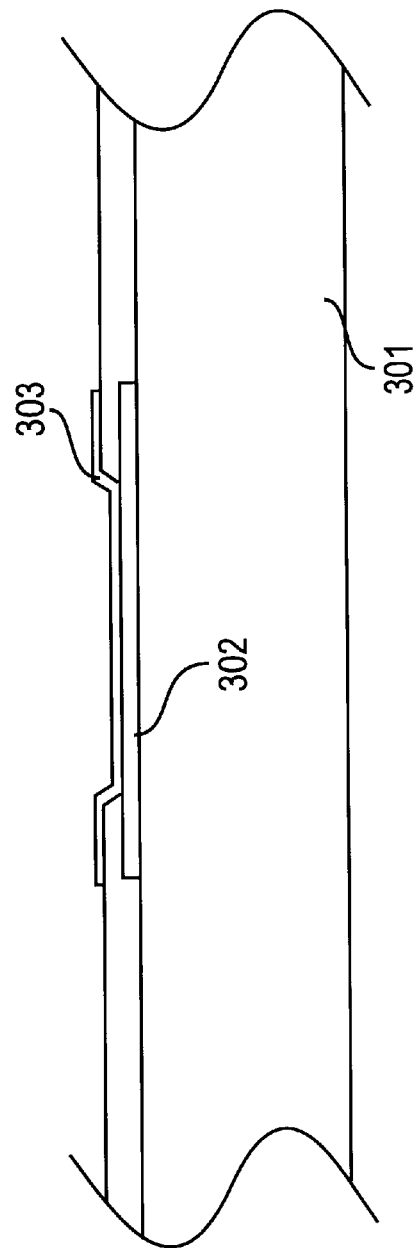

Referring now to FIG. 3A, an integrated circuit (IC) chip 301 similar to that in example 1 is cleaned in an alkaline solution containing 0.05M phosphoric acid at room temperature (25 degrees Celsius) with immersion time of 1 minute. The chip is then thoroughly rinsed in distilled water to ensure there is no residue on its surface. A stake of thin film 303 in the structure of chromium (500 Angstroms)/copper (700 Angstroms)/gold (1000 Angstroms) is deposited and patterned on the terminal pads 302 to serve as the barrier and adhesive layer.

FIG. 3B shows a dielectric substrate 304 having a plurality of electrically conductive circuitry traces 305 partially covered by the solder mask 306. Traces 305 on the substrate 304 extend into the via holes 307 and split into a plurality of leads 308 which are bent toward the inside of the via holes 307. Via holes 307 are formed in such a manner that the terminal pads 302 of the integrated circuit chip 301 can be totally or partially exposed when integrated circuit chip 301 is subsequently mounted on the substrate 304. The bent leads 308 serve as the electrically connecting channels for respective traces 305 of the substrate 304 with respective terminal pads 302 of the integrated circuit chip 301.

As shown in FIG. 3C, the IC chip 301 is next securely attached to the substrate 304 by an adhesive film ABLESTIK "ABLEFILM 561K" 309.

As show in FIG. 3D, the solder paste KESTER SOLDER "R253" 310 is next screen printed into the via holes 307.

As shown in FIG. 3E, the solder paste is next re-flowed at a peak temperature ranging from 210 to 215 degrees Celsius. After the re-flow process, the assembly is cooled down at the rate of 1 degree Celsius per second using ambient air to solidify the solder therein. This re-flow process enables the filled solder to firmly connect to the leads 308 inside the via holes 307 as well as the terminal pads 302 at the bottom of the via holes 307.

As shown in FIG. 3F, the solder ball 311 is next attached to the connection pad of the trace 305 and the package is ready for the next level assembly.

It is to be understood that many solder systems can be applied and serve the connection purpose.

The present invention may be embodied in other specific forms without departing from the spirit or essential characteristics thereof. The presently disclosed embodiments are, therefore, to be considered in all respects as illustrative and not restrictive, the scope of the invention being indicated by the appended claims and all changes which come within the meaning and range of equivalency of the claims are, therefore, to be embraced therein.

What is claimed is:

1. A flip chip assembly, comprising:

a semiconductor chip including a terminal pad;

a substrate including a dielectric layer and an electrically conductive trace, wherein the dielectric layer includes first and second surfaces that are opposite one another and a via hole that extends between the first and second surfaces, the conductive trace is disposed on the first surface and bent proximate to a corner between the first surface and the via hole at a different angle than the corner and extends into the via hole without extending to the second surface and without contacting the terminal pad, the via hole is aligned with the terminal pad, and the second surface is attached to the chip; and an electrically conductive material in the via hole that contacts the conductive trace and electrically connects the conductive trace to the terminal pad.

2. The flip chip assembly as recited in claim 1, wherein the conductive trace contacts substantially none of the dielectric layer at sidewalls of the via hole.

3. The flip chip assembly as recited in claim 1, wherein the conductive material contacts substantially all of the dielectric layer at sidewalls of the via hole.

4. The flip chip assembly as recited in claim 1, wherein the conductive trace laterally extends across a majority of a diameter of the via hole and vertically extends across a majority of a depth of the via hole.

5. The flip chip assembly as recited in claim 1, wherein the terminal pad is directly beneath substantially all surface area defined by the via hole.

6. The flip chip assembly as recited in claim 1, wherein substantially all of the conductive material is within the via hole.

7. The flip chip assembly as recited in claim 1, wherein the conductive trace and the conductive material are the only materials in the via hole.

8. The flip chip assembly as recited in claim 1, wherein the conductive material is a conductive adhesive.

9. The flip chip assembly as recited in claim 1, wherein the conductive material is a conductive polymer.

10. The flip chip assembly as recited in claim 1, wherein the conductive material is solder.

11. A flip chip assembly, comprising:

a semiconductor chip including a terminal pad;

a substrate including a dielectric layer and an electrically conductive trace, wherein the dielectric layer includes first and second surfaces that are opposite one another and a via hole with sidewalls that extends between the first and second surfaces, the conductive trace is disposed on the first surface and bent proximate to a corner between the first surface and the via hole and extends into the via hole without extending to the second surface and without contacting the terminal pad and without contacting a majority of the sidewalls, the via hole is aligned with the terminal pad, and the second surface is attached to the chip; and an electrically conductive material in the via hole that contacts the conductive trace and the sidewalls and electrically connects the conductive trace to the terminal pad.

12. The flip chip assembly as recited in claim 11, wherein the corner forms a first angle, the conductive trace is bent proximate to the corner at a second angle, and the first angle is at least 50 percent larger than the second angle.

13. The flip chip assembly as recited in claim 12, wherein the first angle is about 90 degrees and the second angle is less than about 60 degrees.

14. The flip chip assembly as recited in claim 11, wherein the conductive trace laterally extends across a majority of a diameter of the via hole and vertically extends across a majority of a depth of the via hole.

15. The flip chip assembly as recited in claim 11, wherein the terminal pad is directly beneath all surface area defined by the via hole.

16. The flip chip assembly as recited in claim 11, wherein substantially all of the conductive material is within the via hole and the conductive material fills substantially all of the via hole.

17. The flip chip assembly as recited in claim 11, wherein the conductive trace and the conductive material are the only materials in the via hole.

18. The flip chip assembly as recited in claim 11, wherein the conductive material is a conductive adhesive.

19. The flip chip assembly as recited in claim 11, wherein the conductive material is a conductive polymer.

20. The flip chip assembly as recited in claim 11, wherein the conductive material is solder.

21. A flip chip assembly, comprising:

a semiconductor chip including a terminal pad;

a substrate including a dielectric layer and an electrically conductive trace, wherein the dielectric layer includes first and second surfaces that are opposite one another and a via hole with sidewalls that extends between the first and second surfaces, the top surface and the sidewalls form a corner at a first angle, the conductive trace is disposed on the first surface and bent proximate to the corner at a second angle and extends into the via hole without extending to the second surface and without contacting the terminal pad and without contacting a majority of the sidewalls, the conductive trace laterally extends across a majority of a diameter of the via hole and vertically extends across a majority of a depth of the via hole, the first angle is substantially larger than the second angle, the via hole is aligned with the terminal pad, and the terminal pad does not extend into the via hole;

an adhesive between and in contact with the second surface and the chip; and an electrically conductive material in the via hole that contacts the conductive trace and the terminal pad and the sidewalls and electrically connects the conductive trace to the terminal pad, wherein the conductive trace and the conductive material are the only electrical conductors in the via hole.

22. The flip chip assembly as recited in claim 21 wherein the first angle is about 90 degrees and is at least 50 percent larger than the second angle.

23. The flip chip assembly as recited in claim 21, wherein a portion of the conductive trace within the via hole includes at least three uniformly shaped tips that each point towards an axial center of the via hole.

24. The flip chip assembly as recited in claim 21, wherein the terminal pad is directly beneath all surface area defined by the via hole.

25. The flip chip assembly as recited in claim 21, wherein substantially all of the conductive material is within the via hole and the conductive material fills substantially all of the via hole.

26. The flip chip assembly as recited in claim 21, wherein the conductive material consists essentially of a conductive adhesive, a conductive polymer or solder.

* * * * *